United States Patent
Shimizu et al.

(10) Patent No.: US 10,750,646 B2
(45) Date of Patent: Aug. 18, 2020

(54) ELECTROMAGNETIC SHIELD COMPONENT AND WIRE HARNESS

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Takeshi Shimizu, Yokkaichi (JP); Hirotaka Baba, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/479,261

(22) PCT Filed: Jan. 12, 2018

(86) PCT No.: PCT/JP2018/000712
§ 371 (c)(1),
(2) Date: Jul. 19, 2019

(87) PCT Pub. No.: WO2018/135415
PCT Pub. Date: Jul. 26, 2018

(65) Prior Publication Data
US 2019/0380233 A1    Dec. 12, 2019

(30) Foreign Application Priority Data

Jan. 23, 2017 (JP) ................... 2017-009703
May 31, 2017 (JP) ................... 2017-107703

(51) Int. Cl.
*H05K 9/00* (2006.01)
*H01B 13/26* (2006.01)
*B60R 16/02* (2006.01)

(52) U.S. Cl.
CPC ........ *H05K 9/0098* (2013.01); *B60R 16/0215* (2013.01); *H01B 13/26* (2013.01)

(58) Field of Classification Search
CPC combination set(s) only.
See application file for complete search history.

(56) References Cited

U.S. PATENT DOCUMENTS 1,296,016 A * 3/1919 Smith .................... F16L 15/004
  285/333
2,560,683 A * 7/1951 Buchanan ................ H01R 4/22
  174/87

(Continued)

FOREIGN PATENT DOCUMENTS

JP    2004-178913 A    6/2004
JP    2007-280814 A    10/2007

(Continued)

OTHER PUBLICATIONS

Apr. 10, 2018 International Search Report issued in International Patent Application No. PCT/JP2018/000712.

*Primary Examiner* — Binh B Tran
*Assistant Examiner* — Krystal Robinson
(74) *Attorney, Agent, or Firm* — Oliff PLC (57) ABSTRACT

An electromagnetic shield component that includes a first tube that has conductivity; a flexible shield; and a second tube externally fitted to the first tube with the flexible shield disposed between the first tube and the second tube, wherein: a protrusion is provided on an inner circumferential surface of the second tube over an entire length of the inner circumferential surface in a circumferential direction, the protrusion protruding toward the flexible shield and holding (Continued)

the flexible shield in a pressed state between the first tube and the second tube, and an outer circumferential surface of the protrusion is smoother than an outer circumferential surface of a portion of the second tube where the protrusion is not formed.

11 Claims, 7 Drawing Sheets

(56) References Cited

U.S. PATENT DOCUMENTS

| | | | | |
|---|---|---|---|---|
| 3,924,883 | A * | 12/1975 | Frank | F16L 33/2075 285/256 |
| 4,655,486 | A * | 4/1987 | Tarnay | F16L 19/065 285/334.4 |
| 4,674,833 | A * | 6/1987 | Des Forges | G02B 6/25 385/81 |
| 4,704,498 | A * | 11/1987 | Gregorac | H01R 9/05 174/73.1 |
| 4,719,315 | A * | 1/1988 | Gregorac | H01R 9/05 174/73.1 |
| 5,181,272 | A * | 1/1993 | Hopper | G02B 6/3887 385/139 |
| 5,347,090 | A * | 9/1994 | Cerda | H01R 4/04 156/296 |
| 5,496,259 | A * | 3/1996 | Perkins | A61B 1/00142 600/121 |
| 6,053,639 | A * | 4/2000 | Chen | G02B 6/3825 385/53 |
| 6,390,137 | B1 * | 5/2002 | Ewald | B60H 1/00571 138/114 |
| 6,478,341 | B1 * | 11/2002 | Miyajima | F16L 21/08 285/253 |
| 6,543,817 | B1 * | 4/2003 | Turner | F16L 19/028 285/353 |
| 8,647,261 | B2 | 2/2014 | Jaworek | A61M 25/0111 600/114 |
| 8,657,620 | B2 * | 2/2014 | Knoll | H01R 13/567 439/460 |
| 8,692,114 | B1 * | 4/2014 | Popescu | H05K 9/0018 174/71 R |
| 9,112,287 | B2 * | 8/2015 | Toyama | H01R 4/20 |
| 9,385,440 | B2 * | 7/2016 | Nagahashi | H01R 9/03 |
| 9,490,051 | B2 * | 11/2016 | Inao | H02G 3/0481 |
| 9,566,919 | B2 * | 2/2017 | Kushima | H02G 3/0481 |
| 9,673,578 | B1 * | 6/2017 | Lane | H01R 13/631 |
| 9,694,763 | B2 * | 7/2017 | Andou | B60R 16/0215 |
| 9,873,391 | B2 * | 1/2018 | Suguro | B60R 16/0215 |
| 9,905,337 | B2 * | 2/2018 | Komori | H01B 7/282 |
| 10,086,780 | B2 * | 10/2018 | Sekino | B60R 16/027 |
| 10,136,566 | B2 * | 11/2018 | Suetani | H02G 3/0481 |
| 10,217,542 | B2 * | 2/2019 | Kushima | H01B 5/12 |
| 10,334,767 | B2 * | 6/2019 | Shimizu | B60R 16/0215 |
| 2003/0042032 | A1 * | 3/2003 | Syed | H05K 9/0018 174/36 |
| 2004/0099427 | A1 * | 5/2004 | Kihira | H01R 13/5808 174/359 |
| 2004/0099428 | A1 * | 5/2004 | Miyazaki | H01R 13/655 174/366 |
| 2009/0093159 | A1 | 4/2009 | Aoki et al. | |
| 2009/0098779 | A1 * | 4/2009 | Kawamura | H01R 13/4223 439/733.1 |
| 2009/0117787 | A1 * | 5/2009 | Kerner | H01R 4/20 439/877 |
| 2009/0126985 | A1 * | 5/2009 | Aoki | H02G 3/0683 174/377 |
| 2010/0126752 | A1 * | 5/2010 | Watanabe | H05K 9/0098 174/102 D |
| 2010/0186989 | A1 * | 7/2010 | Alvelo | H01B 7/18 174/113 R |
| 2011/0312211 | A1 * | 12/2011 | Natoli | H01R 13/5205 439/460 |
| 2012/0252265 | A1 * | 10/2012 | Wild | H01R 24/564 439/578 |
| 2012/0312595 | A1 * | 12/2012 | Sawada | B60K 1/00 174/72 A |
| 2012/0312597 | A1 * | 12/2012 | Toyama | H01R 4/182 174/84 C |
| 2013/0032393 | A1 * | 2/2013 | Toyama | H05K 9/0098 174/72 A |
| 2013/0292154 | A1 * | 11/2013 | Aoyama | H05K 9/0088 174/105 R |
| 2013/0306346 | A1 * | 11/2013 | Izawa | H05K 9/00 174/102 R |
| 2014/0262500 | A1 * | 9/2014 | Yaworski | H02G 1/14 174/84 R |
| 2014/0284100 | A1 * | 9/2014 | Ichikawa | B60R 16/0215 174/70 R |
| 2014/0322968 | A1 * | 10/2014 | Burris | H01R 9/05 439/578 |
| 2015/0008032 | A1 * | 1/2015 | Nakai | H02G 3/0468 174/650 |
| 2015/0187469 | A1 | 7/2015 | Inao et al. | |
| 2017/0154709 | A1 * | 6/2017 | Kuroishi | H01B 7/0045 |
| 2018/0037176 | A1 * | 2/2018 | Kodama | H01B 7/2825 |
| 2018/0184552 | A1 * | 6/2018 | Omae | H02G 3/0481 |
| 2018/0294612 | A1 * | 10/2018 | Shimada | H01R 43/048 |
| 2018/0342333 | A1 * | 11/2018 | Izawa | H02G 3/0468 |
| 2019/0181592 | A1 * | 6/2019 | Shimizu | H01B 7/18 |
| 2019/0308571 | A1 * | 10/2019 | Hagi | H01B 7/00 |

FOREIGN PATENT DOCUMENTS

| | | |
|---|---|---|
| JP | 2009-087902 A | 4/2009 |
| JP | 2013-045557 A | 3/2013 |
| JP | 2014-068462 A | 4/2014 |

* cited by examiner

ELECTROMAGNETIC SHIELD COMPONENT AND WIRE HARNESS

This application is the U.S. National Phase of PCT/JP2018/000712 filed Jan. 12, 2018, which claims priority to JP 2017-009703 filed Jan. 23, 2017 and JP 2017-107703 filed May 31, 2017, the entire disclosures of which are incorporated herein by reference.

BACKGROUND

The present disclosure relates to an electromagnetic shield component and a wire harness.

As a conventional wire harness installed in a vehicle, a wire harness is known in which the circumferential surface of a wire is covered with an electromagnetic shield component as a countermeasure against electromagnetic noise (see JP 2007-280814A, for example).

In the electromagnetic shield component, an end portion of a conductive tubular member and an end portion of a conductive braided member are connected to each other by a connecting member, and a wire inserted in a continuous tubular body formed of the tubular member and the braided member is electromagnetically shielded.

In an electromagnetic shield component such as that described above, a crimp ring made of a metal is used as the connecting member that connects the tubular member and the braided member to each other. The crimp ring squeezes the braided member externally put on (externally fitted to) the end portion of the tubular member from the outer side, and the braided member is held between an outer circumferential surface of the tubular member and an inner circumferential surface of the crimp ring. Such a crimp ring has a circular arc-shaped portion and a bent and protruding portion that is bent so as to protrude from the circular arc-shaped portion toward the outer circumferential side in the radial direction, and the braided member is kept squeezed onto the tubular member by performing plastic processing on the bent and protruding portion of the crimp ring.

SUMMARY

In an electromagnetic shield component such as that described above, since the bent and protruding portion of the crimp ring protrudes outward in the radial direction at a connecting portion between the braided member and the tubular member, the electromagnetic shield component, and consequently the wire harness, are at risk of a localized increase in size.

An exemplary aspect of the disclosure provides an electromagnetic shield component and a wire harness in which a localized increase in size can be suppressed.

An electromagnetic shield component that addresses the above-described problem includes a first tube that has conductivity; a flexible shield; and a second tube externally fitted to the first tube with the flexible shield disposed between the first tube and the second tube, wherein: a protrusion is provided on an inner circumferential surface of the second tube over an entire length of the inner circumferential surface in a circumferential direction, the protrusion protruding toward the flexible shield and holding the flexible shield in a pressed state between the first tube and the second tube.

With this configuration, since the protrusion is provided, which protrudes toward the flexible shield from the inner circumferential surface of the second tube externally fitted to the first tube and holds the flexible shield in a pressed state between the first tube and the second tube, the flexible shield can be held between the first tube and the second tube by the protrusion. A bent and protruding portion of a conventional crimp ring made of a metal is no longer necessary, and thus, a localized increase in the size of the electromagnetic shield component can be suppressed.

Moreover, since the protrusion is provided over the entire length of the inner circumferential surface of the second tube in the circumferential direction, the protrusion can apply a uniform pressure to the flexible shield.

It is preferable that in the electromagnetic shield component, an outer diameter of a portion of the second tube where the protrusion is formed is smaller than an outer diameter of the portion of the second tube where the protrusion is not formed.

With this configuration, the outer diameter of the portion of the second tube where the protrusion is formed is smaller than the outer diameter of the portion of the second tube where the protrusion is not formed. For example, the protrusion can be configured by reducing the diameter of the second tube through plastic processing.

It is preferable that in the electromagnetic shield component, an outer circumferential surface of the protrusion is smoother than an outer circumferential surface of a portion of the second tube where the protrusion is not formed.

With this configuration, since the outer circumferential surface of the protrusion is smoother than the outer circumferential surface of the portion of the tube where the protrusion is not formed, the light reflectivity also varies due to the difference in surface roughness, and when the protrusion is to be inspected by a person or a machine, the position at which the protrusion is formed can be easily determined. Moreover, the increased light reflectivity also makes it possible to perform accurate measurement when measuring the protruding length of the protrusion from the outside using various types of machines.

It is preferable that in the electromagnetic shield component, the protrusion has a first holder that holds the flexible shield and a second holder that holds the flexible shield in a state in which the second holder presses the flexible shield further than the first holder.

With this configuration, the protrusion has the first holder and the second holder that apply different pressures. Thus, while the flexible shield is held by the first holder, which applies a relatively low pressure, the flexible shield can be brought into close contact with the first tube by the second holder, which applies a relatively high pressure. Therefore, for example, in the case where the flexible shield is formed of a member that has conductivity, contact resistance between the first tube and the flexible shield can be suppressed.

It is preferable that in the electromagnetic shield component, a plurality of the protrusions are provided.

With this configuration, since the plurality of protrusions are provided, the flexible shield can be held in a pressed state at a plurality of positions.

It is preferable that in the electromagnetic shield component, a protruding length of at least one first protrusion of the plurality of protrusions is different from a protruding length of a second protrusion of the plurality of protrusions.

With this configuration, since the protruding length of at least one first protrusion of the plurality of protrusions is different from the protruding length of a second protrusion, the pressure applied to the flexible shield can be changed depending on the difference in protruding length of the protrusion. Thus, while the flexible shield is held by a protrusion that has a relatively short protruding length, the flexible shield can be brought into close contact with the first tube by a protrusion that has a relatively long protruding length. Therefore, for example, in the case where the flexible shield is formed of a member that has conductivity, contact resistance between the first tube and the flexible shield can be suppressed.

It is preferable that in the electromagnetic shield component, a protruding length of a third protrusion of the plurality of protrusions that is the closest to one end of the flexible shield inserted in the second tube is longer than a protruding length of a fourth protrusion of the plurality of protrusions.

With this configuration, since the protruding length of the protrusion that is the closest to one end of the flexible shield inserted in the second tube is longer than the protruding length of another protrusion, the flexible shield can be brought into close contact with the first tube by the protrusion that has the longer protruding length. Moreover, even if the protrusion that has the longer protruding length causes a rupture on the one end portion side of the flexible shield, the flexible shield can be held by the other protrusion (protrusion other than the protrusion that has the longer protruding length).

It is preferable that in the electromagnetic shield component, a protruding length of a fifth protrusion of the plurality of protrusions that is the farthest from one end of the flexible shield inserted in the second tube is shorter than a protruding length of a sixth protrusion of the plurality of protrusions.

With this configuration, since the protruding length of the protrusion that is the farthest from one end of the flexible shield inserted in the second tube is shorter than the protruding length of another protrusion, even if the other protrusion causes a rupture of the flexible shield, the flexible shield can be held by the protrusion that is located on the opposite side to that end.

It is preferable that in the electromagnetic shield component, the second tube is composed of an aluminum-based metal material.

With this configuration, since the second tube is composed of an aluminum-based metal material, a reduction in the weight of the second tube can be achieved, and favorable workability can be realized during the formation of the protrusion and the like.

It is preferable that in the electromagnetic shield component, the braid, the first tube, and the second tube are composed of a same metal material.

With this configuration, since the braid, the first tube, and the second tube are composed of the same metal material, the occurrence of galvanic corrosion between those members can be suppressed.

It is preferable that in the electromagnetic shield component, the flexible shield is a tubular braid formed of strands that have conductivity.

With this configuration, since the flexible shield is configured by a tubular braid, an electromagnetic shielding effect can be obtained by covering the outer side of the first tube therewith.

A wire harness that addresses the above-described problem includes the electromagnetic shield component according to any one of the above-described configurations and a wire inserted in the electromagnetic shield component.

With this configuration, it is possible to provide a wire harness that achieves a similar effect to any one of the above-described effects.

According to the present disclosure, it is possible to suppress a localized increase in size of the electromagnetic shield component and the wire harness.

DETAILED DESCRIPTION OF EMBODIMENTS

Hereinafter, an embodiment of a wire harness will be described based on the drawings. Note that in the drawings, a configuration may be shown in a partially exaggerated or simplified manner for convenience of description. Moreover, dimensional ratios of various portions may be different from actual dimensional ratios.

Figure 1:
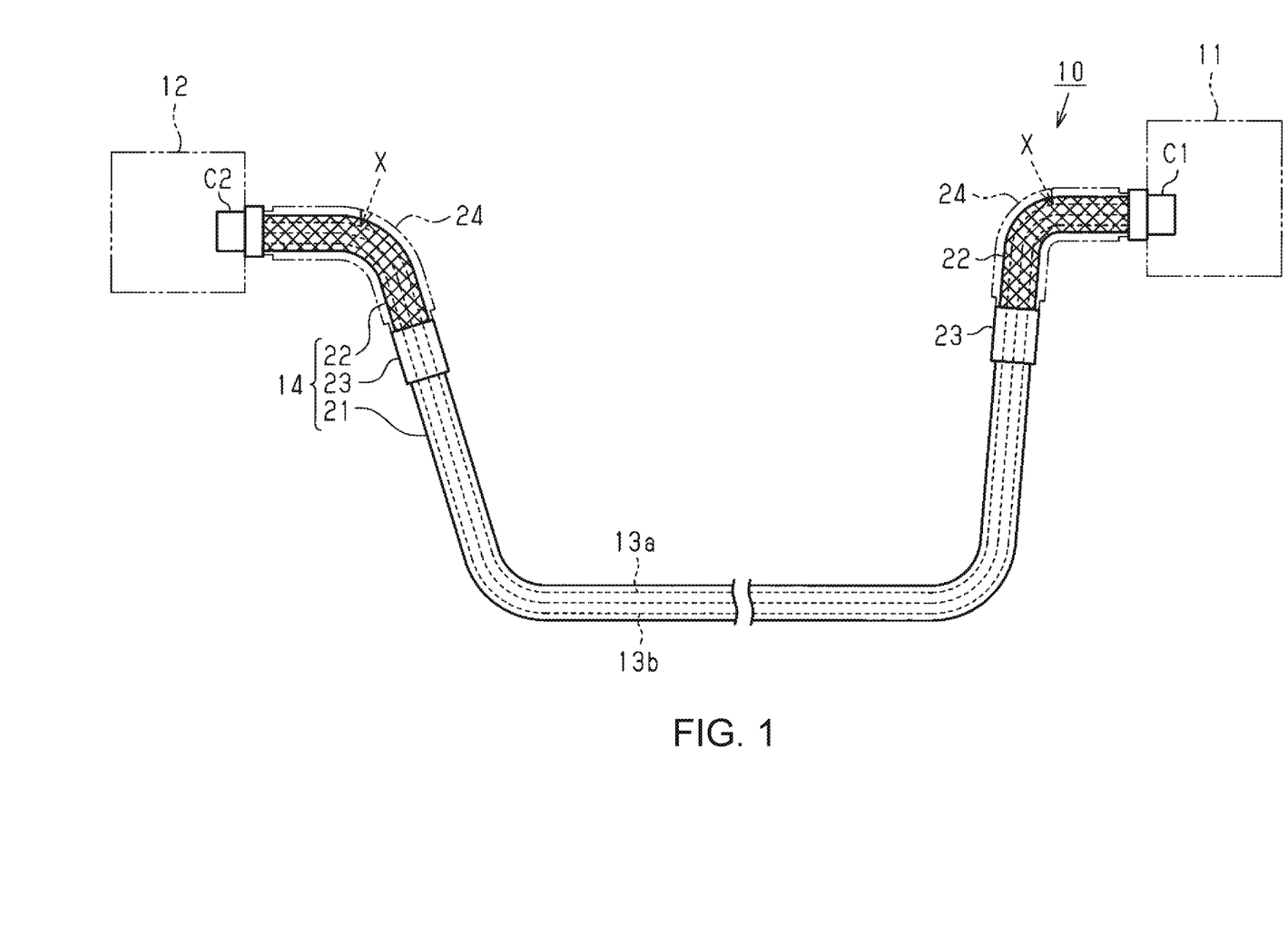
FIG. 1 is a diagram schematically showing the configuration of a wire harness of an embodiment of the present disclosure.

As shown in FIG. 1, in a hybrid vehicle, an electric automobile, or the like, a wire harness 10 of the present embodiment is routed so as to pass under the floor, for example, of the vehicle in order to connect, for example, a high-voltage battery 11 installed in a rear portion of the vehicle and an inverter 12 installed in a front portion of the vehicle to each other. The inverter 12 is connected to a wheel driving motor (not shown) serving as a power source for moving the vehicle, and generates an alternating-current power from a direct-current power of the high-voltage battery 11 and supplies the alternating-current power to the wheel driving motor. The high-voltage battery 11 is a battery capable of supplying a voltage of several hundred volts.

The wire harness 10 includes two high-voltage wires 13a and 13b connected to a positive terminal and a negative terminal, respectively, of the high-voltage battery 11, as well as a tubular electromagnetic shield component 14 that collectively encloses the high-voltage wires 13a and 13b.

Figure 2A:
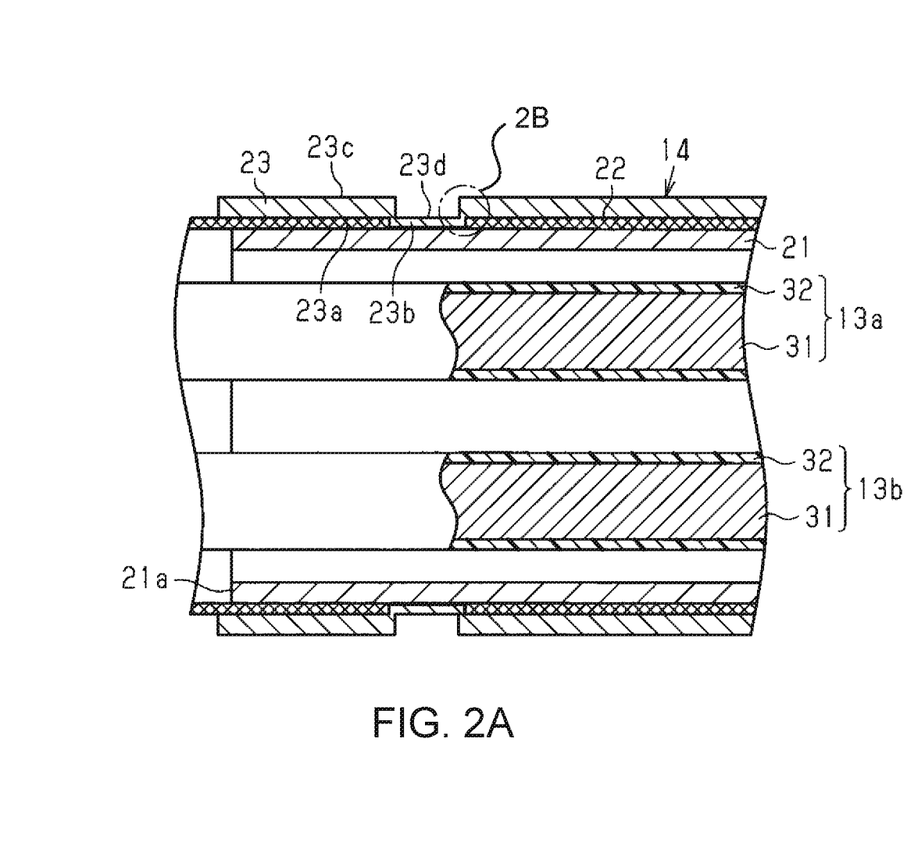
FIG. 2(a) is a partial cross-sectional view of the wire harness in FIG. 1.
Figure 2B:
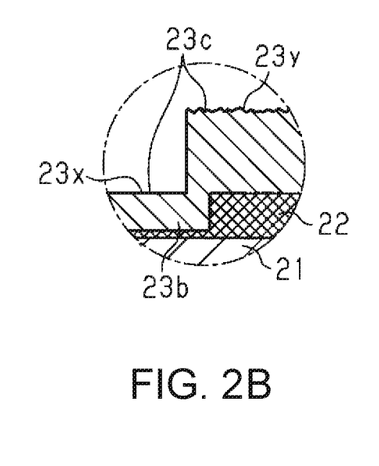
FIG. 2(b) is a partial enlarged view of the wire harness in FIG. 2(a).

As shown in FIG. 2, each of the high-voltage wires 13a and 13b is a coated wire in which a core wire 31 made of a conductor is coated with an insulating coating 32 made of a resin material. The insulating coating 32 is formed on an outer circumferential surface of the core wire 31 through extrusion coating, and coats the outer circumferential surface of the core wire 31 while being in close contact therewith.

Each of the high-voltage wires 13*a* and 13*b* is a non-shielded wire that does not have its own shielding structure, and can withstand high voltage and high current. The high-voltage wires 13*a* and 13*b* are inserted in the electromagnetic shield component 14, and each of the high-voltage wires 13*a* and 13*b* is connected to the high-voltage battery 11 at one end portion via a connector C1 and connected to the inverter 12 at the other end portion via a connector C2.

The electromagnetic shield component 14 has an elongated tubular shape as a whole. Moreover, an intermediate portion of the electromagnetic shield component 14 in a lengthwise direction thereof is formed of a metal pipe 21, and regions of the electromagnetic shield component 14 excluding the portion formed of the metal pipe 21 and including both end portions in the lengthwise direction are formed of braided members 22, which are flexible shielding members.

The metal pipe 21 is formed in a substantially perfectly cylindrical tubular shape. The metal pipe 21 is composed of an aluminum-based metal material, for example. The metal pipe 21 is routed so as to pass under the floor of the vehicle and bent into a predetermined shape appropriate for the under-floor configuration. The metal pipe 21 has an internal space in which at least one, or preferably a plurality of wires are inserted. The metal pipe 21 collectively shields the high-voltage wires 13*a* and 13*b* inserted in the internal space thereof and protects the high-voltage wires 13*a* and 13*b* from a flying stone and the like. The metal pipe 21 may also be referred to as the "wire protecting pipe".

The braided members 22 are tubular members formed by braiding a plurality of metal strands. The metal strands of the braided members 22 can be composed of the same metal material as the metal pipe 21. In the present embodiment, the metal strands of the braided members 22 and the metal pipe 21 are composed of an aluminum-based metal material.

The braided members 22 of the present embodiment are connected to the respective end portions of the metal pipe 21 in the lengthwise direction by fitting pipes 23. The fitting pipes 23 may also be referred to as the "fastening sleeves" for connecting the braided members 22 to the metal pipe 21.

Moreover, as shown in FIG. 1, an outer circumferential surface of each braided member 22 is enclosed by an exterior material 24 such as a corrugated tube, for example.

The braided members 22 each collectively enclose outer circumferential surfaces of outside-the-pipe sections X of the high-voltage wires 13*a* and 13*b*, which are the sections led out from the end portions of the metal pipe 21. Thus, the outside-the-pipe sections X of the high-voltage wires 13*a* and 13*b* are shielded by each braided member 22.

As shown in FIG. 2(*a*), each fitting pipe 23 is formed in a substantially perfectly cylindrical tubular shape. The inner diameter of the fitting pipe 23 is larger than the outer diameter of the corresponding end portion of the metal pipe 21, so that the fitting pipe 23 can be externally fitted to the metal pipe 21.

The fitting pipes 23 are composed of the same aluminum-based metal material as the metal material of the metal pipe 21. The fitting pipes 23 are configured to be fitted to the metal pipe 21 with the braided members 22 disposed between the metal pipe 21 and the respective fitting pipes 23.

Figure 3:
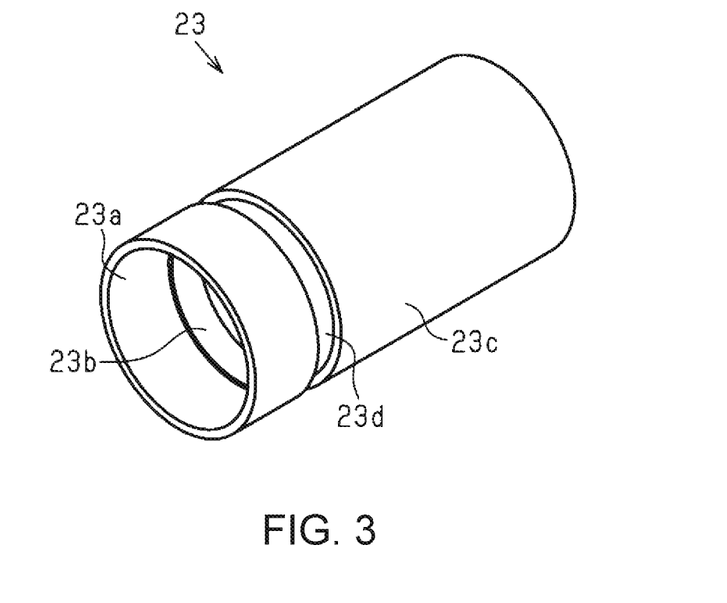
FIG. 3 is a perspective view of a fitting pipe of the wire harness in FIG. 1.

As shown in FIGS. 2(*a*), 2(*b*), and 3, each fitting pipe 23 has a protruding portion 23*b* (protrusion) that protrudes from an inner circumferential surface 23*a* of the fitting pipe 23 toward the inner side in the radial direction. The protruding portion 23*b* is provided over the entire length of the inner circumferential surface 23*a* of the fitting pipe 23 in the circumferential direction. The braided member 22 is held in a pressed state between the fitting pipe 23 and the metal pipe 21 by the protruding portion 23*b*. Thus, the braided member 22 and the metal pipe 21 are electrically connected to each other. The protruding portion 23*b* may be provided at at least one predetermined position in an axial direction of the fitting pipe 23. The protruding portion 23*b* may be an inward-protruding annular ridge that extends continuously in the circumferential direction without interruption. A region of the inner circumferential surface 23*a* of the fitting pipe 23 excluding the protruding portion 23*b* may also be referred to as a "non-protruding surface". After the protruding portion 23*b* is formed in the fitting pipe 23, the protruding portion 23*b* of the fitting pipe 23 locally compresses the braided member 22 in cooperation with the outer surface of the metal pipe 21. As a result, in a state in which the metal pipe 21 and the braided member 22 are connected to each other by the fitting pipe 23, the braided member 22 includes a first portion that is sandwiched between the non-protruding surface of the fitting pipe 23 and the outer surface of the metal pipe 21, the first portion having a first thickness, and a second portion that is sandwiched between the protrusion 23*b* of the fitting pipe 23 and the outer surface of the metal pipe 21, the second portion having a second thickness that is smaller than the first thickness. The protruding portion 23*b* of the fitting pipe 23 locally compresses the braided member 22 in cooperation with the outer surface of the metal pipe 21.

Here, the protruding portion 23*b* is formed on the inner circumferential surface 23*a* of the fitting pipe 23 by, for example, rotating the fitting pipe 23 and a jig, which is not shown, relative to each other to cause the jig to abut against the fitting pipe 23 from the outer side, and thereby plastically deforming the fitting pipe 23 in such a manner as to reduce the diameter thereof. Examples of the processing method for this plastic deformation include spinning and swaging. In this manner, the protruding portion 23*b* is formed. That is to say, in a state in which the fitting pipe 23 prior to spinning or swaging is externally fitted to the metal pipe 21 with the braided member 22 disposed between the metal pipe 21 and the fitting pipe 23, the fitting pipe 23 located on the outer side is subjected to spinning or swaging, and thus the protruding portion 23*b* is formed. Consequently, a groove portion 23*d* is formed in the outer circumferential surface 23*c* of the fitting pipe 23 at a position corresponding to the protruding portion 23*b*. That is to say, the outer diameter of a portion of the fitting pipe 23 where the protruding portion 23*b* is formed is smaller than the outer diameter of a portion of the fitting pipe 23 where the protruding portion 23*b* is not formed.

The protruding portion 23*b* and the groove portion 23*d* are formed at a portion that is spaced apart from the end portions of the fitting pipe 23. In other words, non-reduced-diameter sections are located on both sides of the groove portion 23*d* in the axial direction of the fitting pipe 23.

Moreover, the wall thickness of the portion of the fitting pipe 23 where the protruding portion 23*b* is formed is smaller than, for example, the wall thickness of the portions of the fitting pipe 23 where the protruding portion 23*b* is not formed. In the present example, the metal pipe 21 is not deformed (reduced in diameter) at a position corresponding to the protruding portion 23*b* of the fitting pipe 23. In other words, in the present example, the protruding amount of the protruding portion 23*b* of the fitting pipe 23 is set so as not to deform (reduce the diameter of) the metal pipe 21. Note that it is also possible to deform (reduce the diameter of) the metal pipe 21 at the position corresponding to the protruding portion 23b by setting a large protruding amount of the protruding portion 23b.

As shown in FIG. 2(b), the outer circumferential surface 23c (hereinafter referred to as an outer circumferential surface 23x of the protruding portion 23b) corresponding to the protruding portion 23b is smoother than the outer circumferential surface 23c (hereinafter referred to as other outer circumferential surfaces 23y) of the portions of the fitting pipe 23 where the protruding portion 23b is not formed. That is to say, a configuration is adopted in which the surface roughness of the outer circumferential surface 23x of the protruding portion 23b is lower than the surface roughness of the outer circumferential surfaces 23y.

As described above, since the outer circumferential surface 23x of the protruding portion 23b is smoother than the other outer circumferential surfaces 23y, the light reflectivity varies therebetween. More specifically, the light reflectivity of the outer circumferential surface 23x of the protruding portion 23b is higher than the light reflectivity of the other outer circumferential surfaces 23y. Thus, for example, whether or not the protruding portion 23b is formed in the fitting pipe 23 can be easily judged by a person or a machine. Moreover, during the measurement of the protruding length of the protruding portion 23b using, for example, a contactless optical displacement sensor or the like, if the light reflectivity of the outer circumferential surface 23x of the protruding portion 23b is high, the amount of light that is stably reflected to the sensor increases, and therefore, stable measurement can be performed. Note that although an example in which the protruding length of the protruding portion 23b is measured using a contactless optical displacement sensor is described, the method for measuring the protruding length of the protruding portion 23b is not limited to this method. Also, there are cases where the measurement of the protruding length of the protruding portion 23b is not performed.

The protruding portion 23b of the fitting pipe 23 of the present embodiment is formed so as to protrude inward in the radial direction from the inner circumferential surface 23a by approximately 1 mm. Moreover, the fitting pipe 23 is a pipe made of a metal and has an outer diameter of approximately 24 mm, a thickness of approximately 1 mm, and an inner diameter of approximately 22 mm. That is to say, the fitting pipe 23 has an inner diameter of approximately 20 mm at the position where the protruding portion 23b is formed. The outer diameter of the metal pipe 21 is approximately 20 mm.

Figure 4:
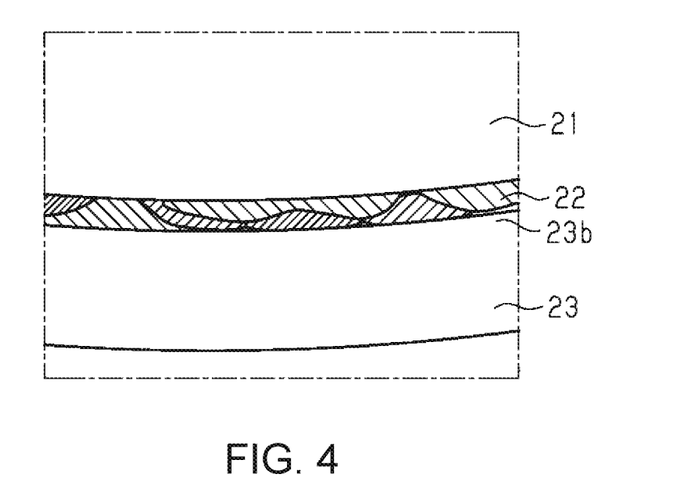
FIG. 4 is a cross-sectional view of an electromagnetic shield component of the wire harness in FIG. 1.

As shown in FIG. 4, the strands of the braided member 22 are pressed and flattened by the protruding portion 23b of the fitting pipe 23. For example, the strands of the braided member 22 pressed by the protruding portion 23b are spread out in the circumferential direction of the fitting pipe 23 and flattened into a sheet-like shape. The strand diameter in the radial direction of strands of the braided member 22 that are flattened by the protruding portion 23b is set to be equal to or smaller than a half of the strand diameter in the radial direction of strands of the braided member 22 that are not flattened by the protruding portion 23b, for example. Moreover, the strand diameter in the circumferential direction of strands of the braided member 22 that are flattened by the protruding portion 23b is set to be equal to or larger than double the strand diameter in the circumferential direction of strands of the braided member 22 that are not flattened by the protruding portion 23b, for example. Here, meshes (gaps between strands) of the braided member 22 are filled with the strands that are spread out in the circumferential direction. In other words, gaps between the fitting pipe 23 (protruding portion 23) and the metal pipe 21 are reduced by flattening the strands of the braided member 22 using the protruding portion 23b. Thus, the area of contact between the outer circumferential surface of the metal pipe 21 and the braided member 22 is increased. In the example shown in FIG. 4, the strands of the braided member 22 are flattened by the protruding portion 23b to such an extent that the meshes (gaps between strands) of the braided member 22 are no longer present. Note that the amount of flattening of the strands of the braided member 22, and the size of the meshes of the braided member 22, can be set by adjusting the protruding amount (depth of the groove portion 23d) of the protruding portion 23b.

Figure 12A:
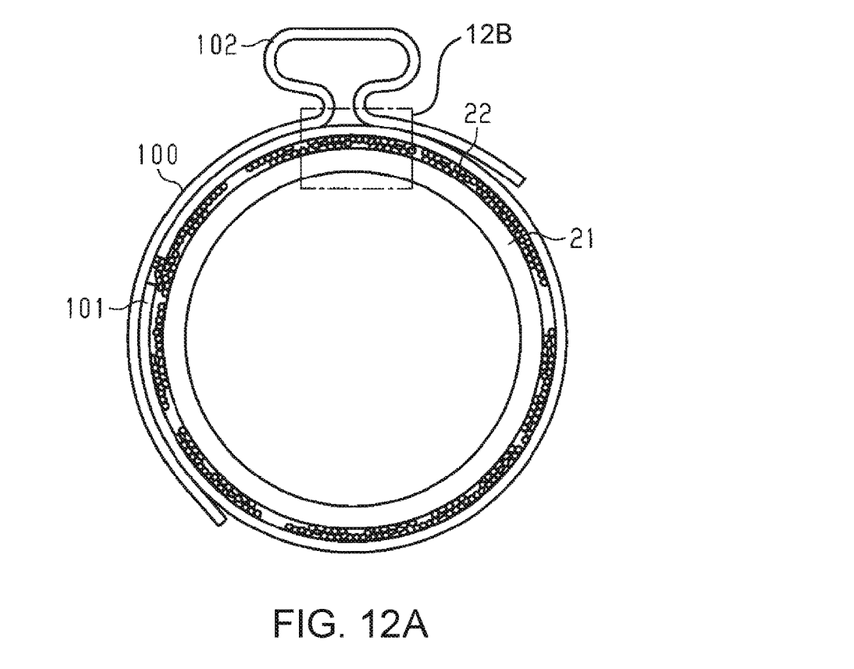
FIG. 12(a) is a cross-sectional view of an electromagnetic shield component of a reference example.
Figure 12B:
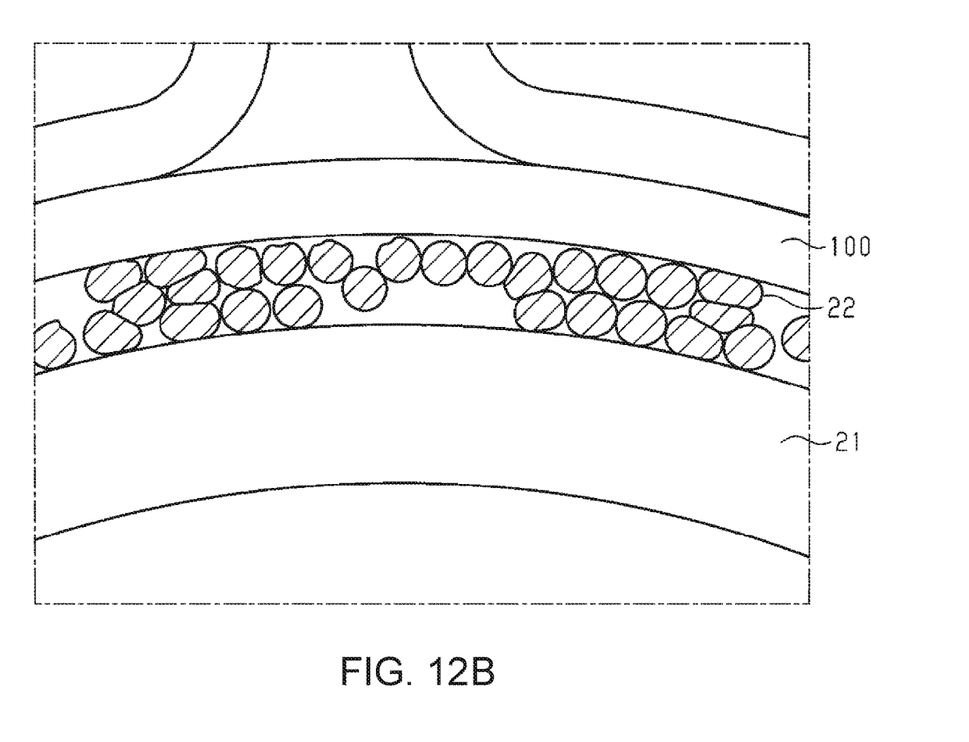
FIG. 12(b) is a partial enlarged view of the electromagnetic shield component in FIG. 12(a).

In a reference example shown in FIGS. 12(a) and 12(b), the metal pipe 21 and the braided member 22 are made to abut against each other and are thereby electrically connected to each other using a crimp ring 100 made of a metal. As can be understood from FIG. 12, in the case where the braided member 22 and the metal pipe 21 are connected to each other using the crimp ring 100, the amount of deformation of the strands of the braided member 22 is slight compared with the configuration of the present example shown in FIG. 4. That is to say, according to the configuration of the present example, the area of contact between the braided member 22 and the outer circumferential surface of the metal pipe 21 increases as a result of the strands of the braided member 22 being pressed and flattened, and therefore, the contact reliability can be improved.

Next, the contact resistance of the electromagnetic shield component 14 of the wire harness 10 that is configured as described above will be described.

The inventors of the present disclosure examined the contact resistance of the electromagnetic shield component 14 of the present example as well as the contact resistance of electromagnetic shield components of two reference examples (Reference Examples 1 and 2). Note that the electromagnetic shield component of Reference Example 1 has a conductive pipe composed of an aluminum-based metal material, a braided member composed of a copper-based metal material, and a crimp ring composed of an iron-based metal material. The electromagnetic shield component of Reference Example 2 has a conductive pipe composed of an aluminum-based metal material, a braided member composed of an aluminum-based metal material, and a crimp ring composed of an iron-based metal material. The crimp rings used in Reference Examples 1 and 2 include, as shown in FIGS. 12(a) and 12(b), a circular arc-shaped portion 101 extending along a circumferential wall of the metal pipe, and a bent and protruding portion 102 that is bent and protrudes toward the outer side of the metal pipe in such a form in which it is bent from both ends of the circular arc-shaped portion 101. That is to say, in these crimp rings, the diameter (inner diameter) of the circular arc-shaped portion 101 can be changed depending on the plastic processing of the bent and protruding portion 102.

Figure 5:
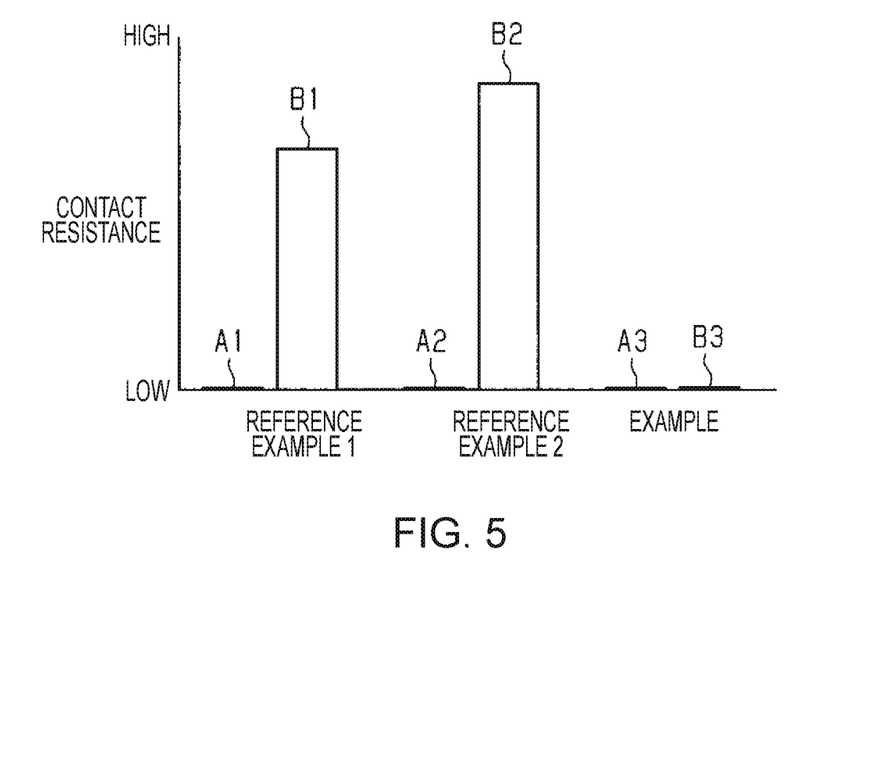
FIG. 5 is a graph comparing the contact resistance of the electromagnetic shield component among an example and reference examples.

In FIG. 5, A1, A2, and A3 indicate the contact resistance in an initial state of Reference Examples 1 and 2 as well as the example of the disclosure, and B1, B2, and B3 indicate the contact resistance in a post-thermal-cycle state of Reference Examples 1 and 2 as well as the example. Compared with the electromagnetic shield component (B1) in the post-thermal-cycle state of Reference Example 1 and the electromagnetic shield component (B2) in the post-thermal-cycle state of Reference Example 2, the electromagnetic shield component 14 (B3) in the post-thermal-cycle state of the present example exhibited a less increase in the contact resistance.

Figure 6:
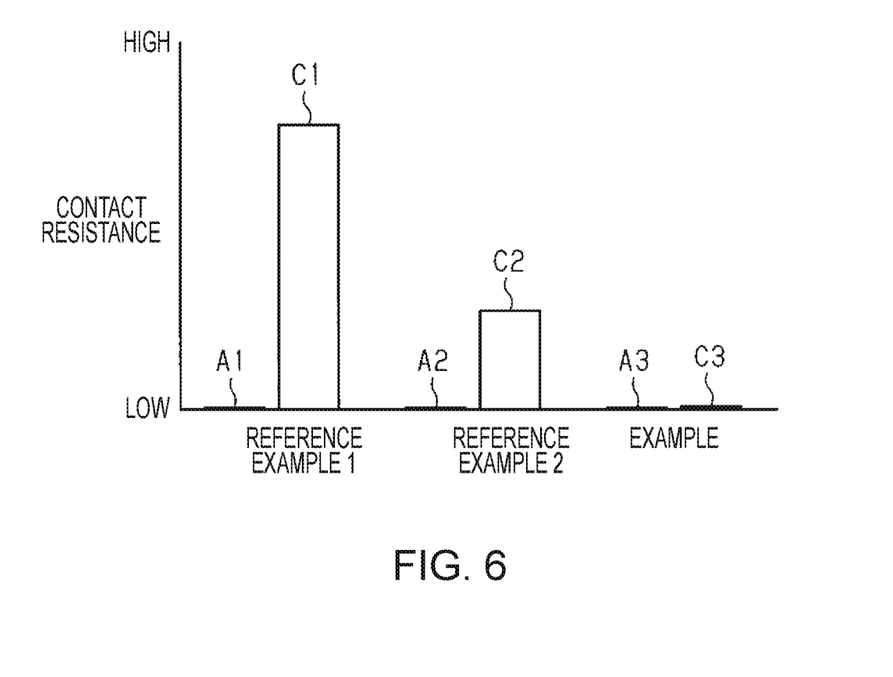
FIG. 6 is a graph comparing the contact resistance of the electromagnetic shield component among the example and the reference examples.

Moreover, in FIG. 6, A1, A2, and A3 indicate the contact resistance in the initial state of Reference Examples 1 and 2 as well as the example of the disclosure, and C1, C2, and C3 indicate the contact resistance after a salt-spray test of Reference Examples 1 and 2 as well as the example. Compared with the electromagnetic shield component (C1) after the salt-spray test of Reference Example 1 and the electromagnetic shield component (C2) after the salt-spray test of Reference Example 2, the electromagnetic shield component 14 (C3) after the salt-spray test of the present example exhibited a less increase in the contact resistance.

As can be seen from FIGS. 5 and 6, in the electromagnetic shield component 14 of the present example, an increase in contact resistance is suppressed compared with those of the electromagnetic shield components of Reference Examples 1 and 2, and accordingly, a decrease in shielding performance is suppressed.

Next, the workings of the present embodiment will be described.

In the wire harness 10 of the present embodiment, the braided member 22 is disposed between the metal pipe 21 serving as a first tubular member (first tube) and the fitting pipe 23 serving as a second tubular member (second tube), and in this state, the diameter of a portion of the fitting pipe 23 is reduced through, for example, spinning, swaging, or the like to thereby form the protruding portion 23b on the inner circumferential surface 23a. This protruding portion 23b protrudes from the inner circumferential surface 23a of the fitting pipe 23 toward the braided member 22 that is located on the inner side in the radial direction. Therefore, the braided member 22 is held in a pressed state between the protruding portion 23b and metal pipe 21, and the metal pipe 21 and the braided member 22 are thus electrically connected to each other.

Moreover, in the fitting pipe 23 of the present embodiment, although the groove portion 23d is formed in the outer circumferential surface 23c through spinning, swaging, or the like, no member locally protruding outward in the radial direction from the outer circumferential surface 23c is present in the fitting pipe 23, and therefore, a localized increase in the size of the electromagnetic shield component 14, and hence the wire harness 10, is suppressed.

Next, the effects of the present embodiment will be described.

(1) The electromagnetic shield component 14 includes the protruding portion 23b that protrudes from the inner circumferential surface 23a of the fitting pipe 23, which is located on the outer side of the metal pipe 21, toward the braided member 22 and that holds the braided member 22 in a pressed state between the fitting pipe 23 and the metal pipe 21. Therefore, the braided member 22 can be held between the fitting pipe 23 and the metal pipe 21 by the protruding portion 23b. Consequently, the necessity for a conventional bent and protruding portion can be eliminated, and thus, a localized increase in the size of the electromagnetic shield component 14 can be suppressed.

(2) The protruding portion 23b is provided over the entire length in the circumferential direction of the inner circumferential surface 23a of the fitting pipe 23, which is the pipe located on the outer side of the fitting pipe 23 and the metal pipe 21, and can therefore apply a substantially uniform pressure to the braided member 22.

(3) The outer diameter of the portion of the fitting pipe 23 where the protruding portion 23b is formed is smaller than the outer diameter of the portions of the fitting pipe 23 where the protruding portion 23b is not formed. That is to say, the protruding portion 23b can be configured by reducing the diameter of the fitting pipe 23 through plastic processing.

(4) Since the outer circumferential surface 23x of the protruding portion 23b is smoother than the outer circumferential surfaces 23y of the portions of the fitting pipe 23 where the protruding portion 23b is not formed, the light reflectivity varies due to the difference in surface roughness, and therefore, when the protruding portion 23b is to be inspected by a person or a machine, the position at which the protruding portion 23b is formed can be easily determined. Moreover, the increased light reflectivity makes it possible to perform accurate measurement when measuring the protruding length of the protruding portion 23b from the outside using various types of machines.

(5) Since the fitting pipe 23 is composed of an aluminum-based metal material, a reduction in the weight of the fitting pipe 23 can be achieved, and favorable workability can be realized when forming the protruding portion 23b or the like.

(6) Since the braided member 22, the metal pipe 21, and the fitting pipe 23 are composed of the same metal material, the occurrence of galvanic corrosion between those members can be suppressed. In particular, as in the present embodiment, in the case of a non-waterproof structure in which a connecting portion between the braided member 22 and the metal pipe 21 serving as the first tubular member is not provided with a cover made of rubber that covers the connecting portion, it is possible to suppress an increase in the number of components while suppressing the occurrence of galvanic corrosion. Moreover, in the present example, since the braided member 22, the metal pipe 21, and the fitting pipe 23 are composed of an aluminum-based metal material, a weight reduction can be achieved.

(7) Since the tubular braided member 22 is employed as a flexible shielding member (flexible shield), the outer side of the metal pipe 21 can be covered, and an electromagnetic shielding effect can be obtained.

Note that the foregoing embodiment may also be changed as follows.

Figure 7:
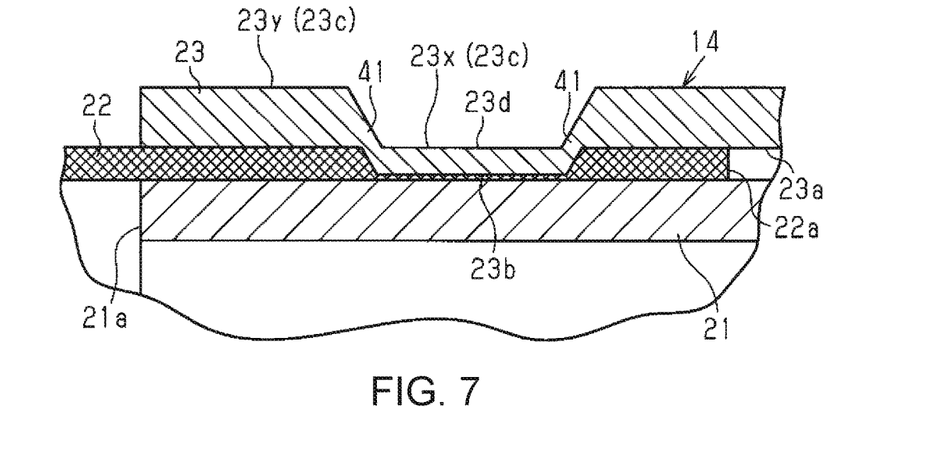
FIG. 7 is a partial cross-sectional view of an electromagnetic shield component of a modification.

As shown in FIG. 7, a configuration may also be adopted in which the protruding portion 23b has tapered portions 41. More specifically, the protruding portion 23b has the tapered portions 41, which are the portions that connect the outer circumferential surface 23x of the protruding portion 23b to the respective outer circumferential surfaces 23y of the portions where the protruding portion 23b is not formed and which intersect the outer circumferential surfaces 23x and 23y. The tapered portions 41 are formed such that the width of the protruding portion 23b decreases from the outer circumferential surface 23y side toward the braided member 22 side. In other words, the tapered portions 41 are formed so as to gradually widen toward the outer side (the distance between the tapered portions 41 increases toward the outer side in the radial direction of the fitting pipe 23). In this manner, problems such as a rupture of the fitting pipe 23 due to an abrupt change caused by the formation of the protruding portion 23b can be suppressed by adopting the configuration in which the protruding portion 23b has the tapered portions 41.

Figure 8:
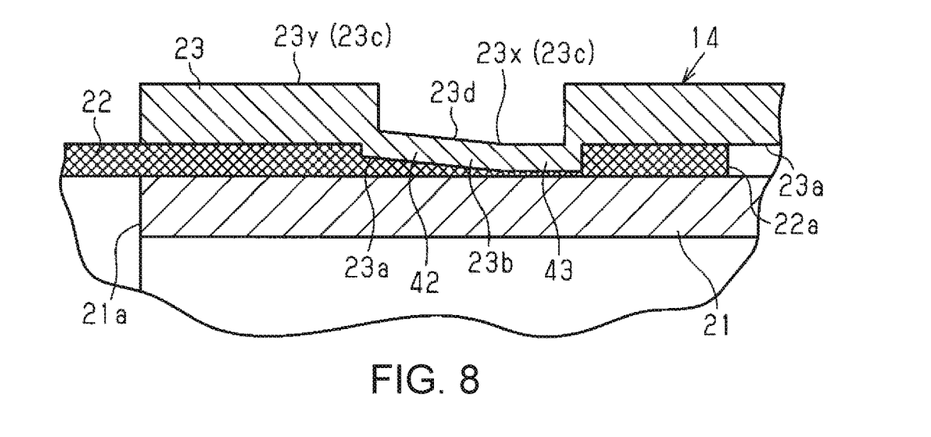
FIG. 8 is a partial cross-sectional view of an electromagnetic shield component of a modification.

As shown in FIG. 8, a configuration may also be adopted in which the protruding length of the protruding portion 23b toward the inner side (braided member 22 side) in the radial direction varies. The protruding portion 23b has a tapered portion 42 and a flat surface portion 43 that is formed continuously with the tapered portion 42. In the present example, the flat surface portion 43 is formed on the side of the protruding portion 23*b* that is closer to an end portion 22*a* of the braided member 22 inserted in the fitting pipe 23, and the tapered portion 42 is formed on the side that is farther from the end portion 22*a* (the side that is closer to an end portion 21*a* of the metal pipe 21 to which the braided member 22 is externally fitted). The tapered portion 42 is formed such that the protruding length of the inner circumferential surface 23*a* of the protruding portion 23*b* gradually changes in the lengthwise direction of the electromagnetic shield component 14 (the axial direction of the fitting pipe 23). The tapered portion 42 of the present example is formed such that the protruding length toward the inner side in the radial direction increases from the end portion 21*a* side of the metal pipe 21 toward the flat surface portion 43 side.

The flat surface portion 43 is formed such that the protruding length of the inner circumferential surface 23*a* of the protruding portion 23*b* is substantially fixed. The flat surface portion 43 of the present example is configured to have a protruding length approximately equal to the protruding length of a section of the tapered portion 42 that protrudes the farthest toward the inner side in the radial direction. That is to say, the flat surface portion 43 holds the braided member 22, which serves as the flexible shielding member, in a state in which it presses the braided member 22 further than the tapered portion 42. That is to say, the tapered portion 42 corresponds to a first holding portion (first holder), and the flat surface portion 43 corresponds to a second holding portion (second holder).

As described above, since the protruding portion 23*b* has the tapered portion 42 and the flat surface portion 43, different pressures are applied to the braided member 22. More specifically, the pressure applied to the braided member 22 by the tapered portion 42 is relatively low, and the pressure applied to the braided member 22 by the flat surface portion 43 is relatively high. Here, if the amount of flattening (the flattening amount) of the strands of the braided member 22 increases, the strands of the braided member 22 become more likely to break, and are therefore weak with respect to a pulling force. The tapered portion 42 can suppress the flattening amount of the strands of the braided member 22 to a small amount while securing the braided member 22 to the metal pipe 21, and can thus favorably suppress breakage of the strands of the braided member 22. Also, the flat surface portion 43, which applies the relatively high pressure, can bring the braided member 22 and the metal pipe 21 into close contact with each other. Therefore, the contact resistance between the metal pipe 21 and the braided member 22 can be suppressed.

Figure 9:
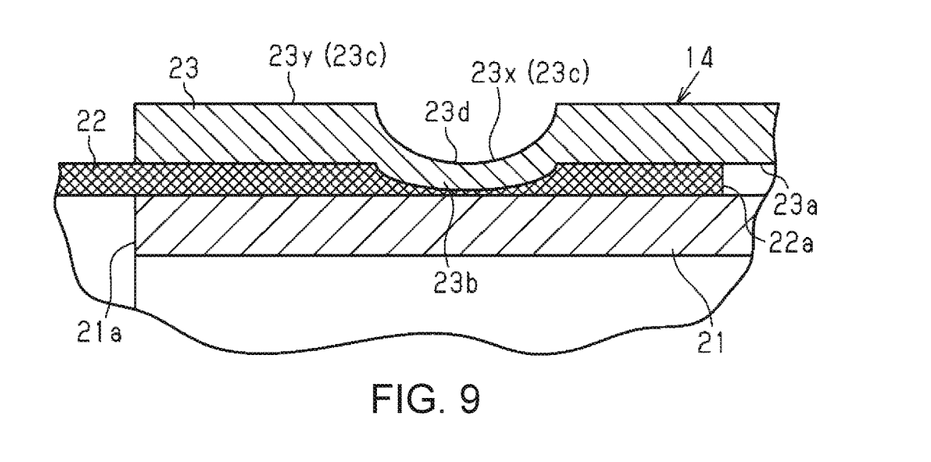
FIG. 9 is a partial cross-sectional view of an electromagnetic shield component of a modification.

Moreover, as shown in FIG. 9, a configuration may also be adopted in which the protruding portion 23*b* protrudes into a curved shape toward the inner side in the radial direction. The pressure applied to the braided member 22 is varied by forming the protruding portion 23*b* into the curved shape. More specifically, the protruding portion 23*b* has a configuration in which a central portion thereof in the axial direction (the lengthwise direction) of the fitting pipe 23 protrudes relatively far. That is to say, the central portion of the protruding portion 23*b* corresponds to the second holding portion that holds the braided member 22 in a state in which it presses the braided member 22 further than the other portions. The portions other than the central portion correspond to the first holding portion. With this configuration, similar effects to those of the configuration shown in FIG. 8 can be obtained.

Figure 10:
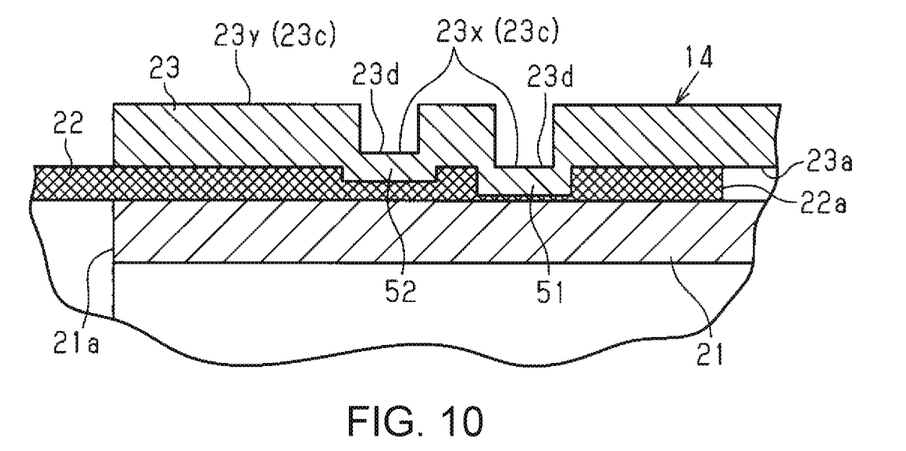
FIG. 10 is a partial cross-sectional view of an electromagnetic shield component of a modification.

As shown in FIG. 10, a configuration may also be adopted in which a plurality of protruding portions 51 and 52 are provided at positions that are spaced apart from each other in the axial direction (the lengthwise direction) of the fitting pipe 23. The braided member 22 can be held in a pressed state at a plurality of positions by providing the plurality of protruding portions 51 and 52.

Moreover, in the configuration shown in FIG. 10, the two protruding portions 51 and 52 are provided spaced apart from each other in the axial direction of the fitting pipe 23, and the protruding lengths toward the inner side in the radial direction of one protruding portion 51 and the other protruding portion 52 are set to be different from each other. More specifically, the protruding length of the protruding portion 51 that is the closest to the end portion 22*a* of the braided member 22 inserted in the fitting pipe 23 is longer than the protruding length of the other protruding portion 52. In other words, the protruding length of the protruding portion 52 that is the farthest from the end portion 22*a* of the braided member 22 inserted in the fitting pipe 23 is shorter than the protruding length of the other protruding portion 51.

Since the protruding length of the protruding portion 51 that is the closest to the end portion 22*a* of the braided member 22 is longer than the protruding length of the other protruding portion 52 as described above, the protruding portion 51 having the longer protruding length can bring the braided member 22 and the metal pipe 21 into close contact with each other. Therefore, the contact resistance between the metal pipe 21 and the braided member 22 can be suppressed. Moreover, even if the protruding portion 51 having the longer protruding length causes a rupture on the end portion 22*a* side of the braided member 22, the braided member 22 can be held by the other protruding portion 52 that is located relatively close to the opposite side to the end portion 22*a*. Note that in the case where the number of protrusions is three or more as well, similar effects can be obtained by providing the protruding portion having a long protruding length on the end portion 22*a* side and providing the protruding portion having a short protruding length on the opposite side to the end portion 22*a*.

In the configuration shown in FIG. 10, the protruding lengths of the two protruding portions 51 and 52 are set to be different from each other, but a configuration may also be adopted in which the protruding lengths of the protruding portions 51 and 52 are equal to each other.

Although not specifically mentioned in the foregoing embodiment, for example, the metal pipe 21, the braided member 22, and the fitting pipe 23 may also be composed of materials having different degrees of hardness. In this case, by forming the fitting pipe 23 that is located on the outer side using a relatively soft material, the fitting pipe 23 can be actively deformed during the formation of the protruding portion 23*b*, and the amounts of deformation of the metal pipe 21 and the braided member 22 can be suppressed. Note that in the case of such a configuration, the metal pipe 21, the braided member 22, and the fitting pipe 23 may or may not be composed of the same metal material.

In the foregoing embodiment, the metal pipe 21 serving as the first tubular member and the fitting pipe 23 serving as the second tubular member have a substantially perfectly cylindrical tubular shape, but these pipes may also have an elliptical tubular shape. Examples of the first tubular member having an elliptical tubular shape include a connector shielding shell that covers the connector C1, and the like. Hereinafter, an example in which a connector shielding shell is adopted will be described.

Figure 11A:
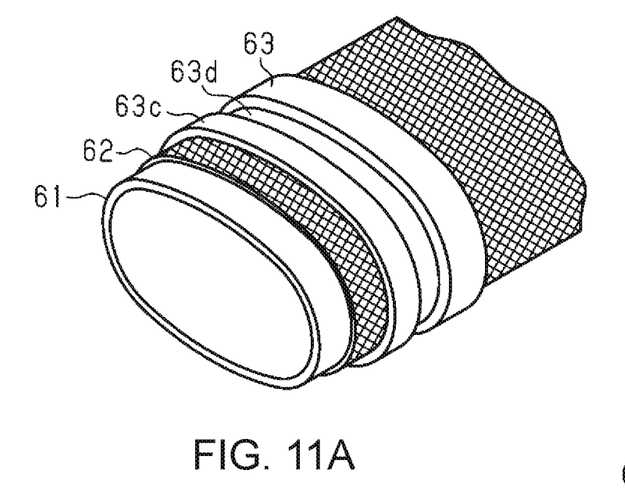
FIG. 11(a) is a perspective view of an electromagnetic shield component of a modification.
Figure 11B:
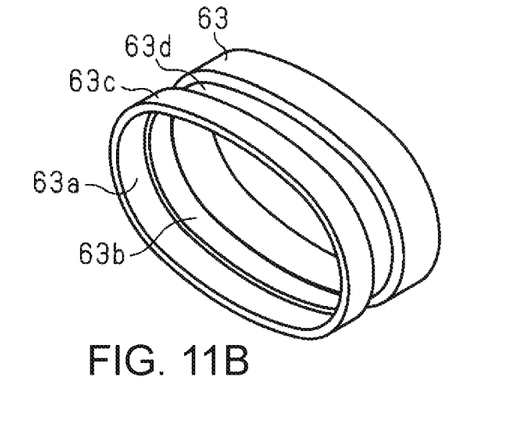
FIG. 11(b) is a perspective view of a fitting pipe of the modification.

As shown in FIGS. 11(a) and 11(b), the electromagnetic shield component has an elliptical tubular connector shielding shell 61, an elliptical tubular braided member 62 that covers the outer side of the connector shielding shell 61, and an elliptical tubular fitting pipe 63 that covers the outer side of the braided member 62.

The connector shielding shell 61 may be formed by, for example, using a metal material, such as iron, as a base and performing aluminum plating so as to cover the entire base, or may be formed through aluminum die casting. With such configurations, the occurrence of galvanic corrosion in the case where the connector shielding shell 61 is electrically connected to the braided member 62 made of an aluminum-based metal can be suppressed.

The braided member 62 has an elliptical tubular shape, but otherwise has substantially the same configuration as the braided member 22 of the foregoing embodiment. Note that since the braided member 62 has flexibility, a configuration can be adopted in which the elliptical tubular shape is realized by deforming a braided member having a substantially perfectly circular shape. That is to say, a configuration may be adopted in which only a portion that covers the connector shielding shell 61 has an elliptical tubular shape, and the other portions have a substantially perfectly circular shape.

The fitting pipe 63 is configured to have conductivity and have an elliptical tubular shape. An inner circumferential surface 63a of the fitting pipe 63 has a protruding portion 63b that protrudes inward in the radial direction from the inner circumferential surface 63a as is the case with the foregoing embodiment. The protruding portion 63b is provided over the entire length of the inner circumferential surface 63a of the fitting pipe 63 in the circumferential direction. The braided member 62 is held in a pressed state between the fitting pipe 63 and the connector shielding shell 61 by the protruding portion 63b. Thus, the braided member 62 and the connector shielding shell 61 are electrically connected to each other. Moreover, as is the case with the foregoing embodiment, a groove portion 63d is formed in an outer circumferential surface 63c of the fitting pipe 63 at a position corresponding to the protruding portion 63b. That is to say, the outer diameter of a portion of the fitting pipe 63 where the protruding portion 63b is formed is smaller than the outer diameter of portions of the fitting pipe 63 where the protruding portion 63b is not formed.

In the foregoing embodiment and the foregoing modifications, a configuration is adopted in which the fitting pipe 23 is externally fitted to the metal pipe 21, but a configuration may also be adopted in which the metal pipe 21 is externally fitted to the fitting pipe 23. That is to say, the inner diameter of the metal pipe 21 is set to be larger than the outer diameter of the fitting pipe 23, and the fitting pipe 23, the braided member 22, and the metal pipe 21 are arranged in that order from the inner side in the radial direction. In this case, the protruding portion is provided on an inner circumferential surface of the metal pipe 21. In the above-described configuration, an outer circumferential surface of a portion of the metal pipe 21 that corresponds to the protruding portion is smoother than outer circumferential surfaces of portions of the metal pipe 21 where the protruding portion is not formed. That is to say, the surface roughness of the outer circumferential surface of the portion corresponding to the protruding portion is lower than the surface roughness of the outer circumferential surfaces of the other portions.

In the foregoing embodiment and the foregoing modifications, the configuration is adopted in which the braided member 22 or 62 is employed as the flexible shielding member, but the braided member 22 or 62 may be changed to a metal sheet, a metal woven fabric, or the like.

In the foregoing embodiment and the foregoing modifications, the metal pipe 21 may also be changed to a shielding pipe having a structure in which, for example, a conductive shielding layer and an resin outer layer are laminated in that order on an outer circumferential surface of a pipe main body made of a nonmetal (resin or the like). In this case, in a portion where the resin outer layer is partially removed to expose the conductive shielding layer, the shielding layer and the braided member 22 may be electrically connected to each other using the fitting pipe 23.

Moreover, the fitting pipe 23 may be internally fitted to the metal pipe 21. In this case, in a portion where the pipe main body, which is an inner layer, is partially removed to expose the conductive shielding layer, the shielding layer and the braided member 22 may be electrically connected to each other using the fitting pipe 23.

Although not specifically mentioned in the foregoing embodiment and the foregoing modifications, a configuration may also be adopted in which a cover made of rubber is inserted and attached to the connecting portion between the metal pipe 21 and the braided member 22, the cover covering an outer circumferential surface of the connecting portion and suppressing the entry of water therethrough.

In the foregoing embodiment and the foregoing modifications, the braided member 22, the metal pipe 21, and the fitting pipe 23 are composed of an aluminum-based metal material, but there is no limitation to this. The braided member 22, the metal pipe 21, and the fitting pipe 23 may also be composed of different conductive materials. Moreover, the braided member 22, the metal pipe 21, and the fitting pipe 23 may also be composed of the same conductive material other than an aluminum-based metal material.

The wire harness 10 of the foregoing embodiment has a configuration in which the two high-voltage wires 13a and 13b are inserted in the electromagnetic shield component 14, but the configuration of a wire inserted in the electromagnetic shield component 14 may be appropriately changed depending on the configuration of the vehicle. For example, a configuration may also be adopted in which a power supply low-voltage wire for connecting a low-voltage battery having a rated voltage of 12 V or 24 V to various types of low-voltage devices (e.g., a lamp, a car audio system, and the like) and driving the various types of low-voltage devices is added as a wire inserted in the electromagnetic shield component 14.

The arrangement relationship between the high-voltage battery 11 and the inverter 12 in the vehicle is not limited to that of the foregoing embodiment, and may be appropriately changed depending on the configuration of the vehicle. Moreover, in the foregoing embodiment, the high-voltage battery 11 is connected to the inverter 12 via the high-voltage wires 13a and 13b, but a configuration may also be adopted in which the high-voltage battery 11 is connected to a high-voltage device other than the inverter 12.

In the foregoing embodiment, the present disclosure is applied to the wire harness 10, which connects the high-voltage battery 11 and the inverter 12 to each other, but in addition to this, the present disclosure may be applied to, for example, a wire harness that connects the inverter 12 and the wheel driving motor to each other.

The foregoing embodiment and modifications may be combined as appropriate.

The present disclosure encompasses the following implementation examples, in which the reference numerals of the constituent elements of the embodiment are used in order to facilitate the understanding rather than for restriction.

Additional Remark 1

An electromagnetic shield component (14) of some implementation examples includes:

a wire protecting pipe (21 or 61) having an end portion (21*a*) and an internal space in which at least one wire (13) is inserted;

a tubular flexible shielding member (22) that covers an outer surface of the wire protecting pipe (21 or 61) on at least the end portion (21*a*) of the wire protecting pipe (21 or 61) so as to overlap with the wire protecting pipe (21 or 61); and a fastening sleeve (23 or 63) having an inner surface, the fastening sleeve (23 or 63) being configured to connect the flexible shielding member (22) and the wire protecting pipe (21 or 61) to each other by the inner surface of the fastening sleeve (23 or 63) pressing the flexible shielding member (22) against the outer surface of the wire protecting pipe (21 or 61) in the overlapping portion between the flexible shielding member (22) and the wire protecting pipe (21 or 61), wherein the inner surface of the fastening sleeve (23 or 63) includes:

at least one inward-protruding annular ridge (23*b* or 51 and 52) that is provided at at least one predetermined position in the axial direction of the fastening sleeve (23 or 63) and extends continuously in the circumferential direction without interruption; and a non-protruding surface excluding the inward-protruding annular ridge (23*b* or 51 and 52), and in a state in which the flexible shielding member (22) and the wire protecting pipe (21 or 61) are fixedly connected to each other by the fastening sleeve (23 or 63), the flexible shielding member (22) includes:

a first portion that is sandwiched between the non-protruding surface of the fastening sleeve (23 or 63) and the outer surface of the wire protecting pipe (21 or 61), the first portion having a first thickness; and a second portion that is sandwiched between the at least one inward-protruding annular ridge (23*b* or 51 and 52) of the fastening sleeve (23 or 63) and the outer surface of the wire protecting pipe (21 or 61), the second portion having a second thickness that is smaller than the first thickness.

Additional Remark 2

In some implementation examples, when viewed in the axial direction of the fastening sleeve (23 or 63), the thickness of the fastening sleeve (23 or 63) at the position of the at least one inward-protruding annular ridge (23*b* or 51 and 52) is fixed.

Additional Remark 3

In some implementation examples, when viewed in the axial direction of the fastening sleeve (23 or 63), the thickness of the fastening sleeve (23 or 63) at the position of the non-protruding surface is fixed.

Additional Remark 4

In some implementation examples, in the state in which the flexible shielding member (22) and the wire protecting pipe (21 or 61) are fixedly connected to each other by the fastening sleeve (23 or 63), the thickness of the fastening sleeve (23 or 63) at the position of the at least one inward-protruding annular ridge (23*b* or 51 and 52) is smaller than the thickness of the fastening sleeve (23 or 63) at the position of the non-protruding surface.

Additional Remark 5

In some implementation examples, the inner surface of the fastening sleeve (23 or 63) has a step between the at least one inward-protruding annular ridge (23*b* or 51 and 52) and the non-protruding surface.

Additional Remark 6

In some implementation examples, the at least one inward-protruding annular ridge (23*b* or 51 and 52) is configured to locally compress the flexible shielding member (22) on the outer surface of the wire protecting pipe (21 or 61).

Additional Remark 7

In some implementation examples, the at least one inward-protruding annular ridge (51 and 52) is realized by a plurality of inward-protruding annular ridges (51 and 52) that are provided at a plurality of predetermined positions in the axial direction of the fastening sleeve (23 or 63).

Additional Remark 8

In some implementation examples, the plurality of inward-protruding annular ridges (51 and 52) include two ridges (51 and 52) that are spaced apart from each other in the axial direction of the fastening sleeve (23 or 63) and are parallel to each other.

Additional Remark 9

In some implementation examples, the flexible shielding member (22) is a conductive braided member.

Additional Remark 10

In some implementation examples, the wire protecting pipe (21 or 61) is a metal tube that has conductivity and shape retainability.

It will be apparent to those skilled in the art that the present disclosure may be embodied in other specific forms without departing from the technical ideas thereof. For example, some of the components described in the embodiment (or one or more variations thereof) may be omitted, or some of the components may be combined.

The invention claimed is:

1. An electromagnetic shield component comprising:
 a first tube that has conductivity;
 a flexible shield; and
 a second tube externally fitted to the first tube with the flexible shield disposed between the first tube and the second tube, wherein:
 protrusion is provided on an inner circumferential surface of the second tube over an entire length of the inner circumferential surface in a circumferential direction, the protrusion protruding toward the flexible shield and holding the flexible shield in a pressed state between the first tube and the second tube, and
 an outer circumferential surface of the protrusion is smoother than an outer circumferential surface of a portion of the second tube where the protrusion is not formed.

2. The electromagnetic shield component according to claim 1, wherein an outer diameter of a portion of the second tube where the protrusion is formed is smaller than an outer diameter of the portion of the second tube where the protrusion is not formed.

3. The electromagnetic shield component according to claim 1,
wherein the protrusion has a first holder that holds the flexible shield and a second holder that holds the flexible shield in a state in which the second holder presses the flexible shield further than the first holder.

4. The electromagnetic shield component according to claim 1,
wherein a plurality of the protrusions are provided.

5. The electromagnetic shield component according to claim 4,
wherein a protruding length of at least one first protrusion of the plurality of protrusions is different from a protruding length of a second protrusion of the plurality of protrusions.

6. The electromagnetic shield component according to claim 5,
wherein a protruding length of a third protrusion of the plurality of protrusions that is the closest to one end of the flexible shield inserted in the second tube is longer than a protruding length of a fourth protrusion of the plurality of protrusions.

7. The electromagnetic shield component according to claim 5,
wherein a protruding length of fifth protrusion of the plurality of protrusions that is farthest from one end of the flexible shield inserted in the second tube is shorter than a protruding length of a sixth protrusion of the plurality of protrusions.

8. The electromagnetic shield component according to claim 1,
wherein the second tube is composed of an aluminum-based metal material.

9. The electromagnetic shield component according to claim 1,
wherein the flexible shield, the first tube, and the second tube are composed of a same metal material.

10. The electromagnetic shield component according to claim 1,
wherein the flexible shield is a tubular braid formed of strands that have conductivity.

11. A wire harness comprising:
the electromagnetic shield component according to claim 1; and
a wire inserted in the electromagnetic shield component.

* * * * *